United States Patent
Galloway et al.

(10) Patent No.: US 6,937,069 B2
(45) Date of Patent: Aug. 30, 2005

(54) SYSTEM AND METHOD FOR DEAD-BAND DETERMINATION FOR ROTATIONAL FREQUENCY DETECTORS

(75) Inventors: Brian J. Galloway, Merlo Park, CA (US); Thomas A. Knotts, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/601,993

(22) Filed: Jun. 23, 2003

(65) Prior Publication Data

US 2004/0257118 A1 Dec. 23, 2004

(51) Int. Cl.[7] .............................................. G01R 23/02
(52) U.S. Cl. ........................................ 327/39; 327/156
(58) Field of Search .............................. 327/39, 40, 41, 327/42, 45, 46, 47, 156, 158, 147, 148, 149; 375/375, 374, 376; 331/1 A, 25

(56) References Cited

U.S. PATENT DOCUMENTS

| | | | |
|---|---|---|---|
| 6,055,286 A | 4/2000 | Wu et al. | .................. 375/375 |
| 6,310,521 B1 * | 10/2001 | Dalmia | ........................ 331/11 |
| 6,392,495 B1 * | 5/2002 | Larsson | ....................... 331/11 |

OTHER PUBLICATIONS

Pottbacker, Ansgar, et al. "A Si Bipolar Phase and Frequency Detector IC for Clock Extraction up to 8 Gb/s", IEEE journal of Solid–State Circuits. vol. 27, No. 12, Dec. 1992, pp. 1747–1751.
Rabaey, J.M., "Digital Integrated Circuits", Prentice Hall, 1996, pp. 533–538.

* cited by examiner

*Primary Examiner*—Linh My Nguyen

(57) ABSTRACT

In one embodiment a system and method is arranged for bridging the dead-band when asynchronous signals are compared against each other. There is developed a pair of phase related signals from one of the signals, each phase related signal phase shifted from each other, but having the same frequency as the signal from which it was derived. The other frequency signal is compared against each of the phase-related developed signals to generate an error signal which quadrature rotates when the first and second signals are out of frequency with each other. A control signal is generated when the quadrature rotation is outside a certain limit. The error signal is controllably buffered to insure that the error signal only occurs when the frequencies are offset for a selected period of time.

19 Claims, 5 Drawing Sheets

SYSTEM AND METHOD FOR DEAD-BAND DETERMINATION FOR ROTATIONAL FREQUENCY DETECTORS

TECHNICAL FIELD

This invention relates to frequency synchronization circuits and more particularly to systems and methods for dead-band control for clock and data recovery circuits.

BACKGROUND OF THE INVENTION

Frequency detectors are used in a wide variety of circuits, such as, for example, phase locked loop (PLL) circuits in which the frequency range of the oscillator exceeds the pull-in range of the phase detector. The frequency detector must be able to 1) detect both the magnitude and polarity of the frequency difference, and 2) yield to the phase detector once the frequency error is determined to be within a small range (also referred to as the dead-band region). When the circuit is operating in or near phase lock, any glitch or false indication from the frequency detector dead-band indicator could cause the PLL to lose lock. Current dead-band detectors produce glitches due to metastability, which then causes the PLL to temporarily lose lock.

A typical clock and data recovery circuit (CDR) contains both a frequency and phase detector circuit. The circuit is composed of two loops, with either a phase locked loop or a frequency acquisition loop active at one time. A multiplexor, controlled by the frequency detector, selects either the frequency acquisition loop or the phase locked loop. The dead-band detection circuit typically resides in the frequency detection circuit and is key to determining which loop is active (in control) at a particular time. If the dead-band circuit gives a false indication or produces a glitch, the PLL is broken and the circuit could drift out of phase lock. This type of circuit is described in A. Pottbacker, et al., "A Si Bipolar Phase and Frequency Detector IC for Clock Extraction up to 8 Gb/s", *IEEE Journal of Solid-State Circuits*, Vol. SC-27, pp. 1747–1751, 1992.

Frequency detectors typically operate by comparing an unknown frequency to a known or reference frequency. In the case of the prior art circuit in FIG. 1, the frequency detector compares the VCO frequency to the reference frequency $F_{ref}$. It is typical for the reference frequency to be close, but not equal to, the desired operating frequency. Since the desired frequency can be different from the reference frequency, the frequency detector must be able to compare two signals that are asynchronous. In order for a digital frequency detector to compare two asynchronous signals, one must sample the other. This circuit is sometimes referred to as a synchronizer.

There have been many papers written having as their premise that a perfect synchronizer is impossible to build due to the metastability of the latching circuit, J. M. Rabaey, *Digital Integrated Circuits*, Prentice Hall, 1996, pp. 533–538; B. Wu, et al., "Oversampling Rotational Frequency Detector", U.S. Pat. No. 6,055,286. With one asynchronous signal sampling another (assuming both have finite rise times), the sampling signal will at some times sample the transition of another. This means that the sampled signal is neither a logic 1 nor a logic zero, but somewhere between. Any latching circuit will have a balance point where for any input signal above this point, a logic 1 is latched and below this point, a logic 0 is latched. This point is called the metastable point. The regenerative nature of latching circuits causes any sampled signal to diverge from the metastable point exponentially with time. The output voltage after the sampling instant can be described as $v(t)=V_{MS}+(v(0)-V_{MS})e^{t/\tau}$ where $V_{MS}$ is the metastable voltage, $v(0)$ is the initial voltage, and $\tau$ is the regenerative time constant of the latch. From this equation, the time it takes to reach a voltage $V_{FS}$ the full-scale voltage, is given by $$t = \tau \ln\left(\frac{V_{FS} - V_{MS}}{v(0) - V_{MS}}\right).$$

From this equation, it can be seen that the time it takes to resolve an input signal goes to infinity as $v(0)$ approaches $V_{MS}$. The time it takes is also proportional to the time constant of the latch. This means the probability of a sampled signal not resolving to a known logic level is decreased the longer the latch regenerates and the lower the time constant of the latch. The problem with metastability is that a signal that has not resolved to a known state can branch to multiple paths. Each path could interpret the signal in a different way, causing an erroneous output.

Common methods for synchronization involve adding delay (usually through a cascade of latches) and using latches with small time constants to reduce the probability that a signal has not regenerated to a known level. Both methods have drawbacks. The more latches that are added, the larger the power and area consumed. For most common circuit technologies, more power is needed to reduce the time constant of a given latch topology.

One solution to the frequency acquisition problem in clock and data recovery circuits, and particularly for phase-locked loop control, is shown in Wu, et al., U.S. Pat. No. 6,055,286, issued Apr. 25, 2000, which patent is hereby incorporated by reference herein.

BRIEF SUMMARY OF THE INVENTION

The proposed invention is a dead-band detector for a rotational frequency detector. It makes use of the properties of quadrature input signals and the properties of the rotating sampling reference to guard against glitches due to metastability problems. This circuit does not rely on traditional methods for synchronization for sampling an asynchronous signal which add power and latency. Instead it gains regeneration time by waiting to use asynchronous signals until the inputs have rotated one quarter of a period against the reference.

In one embodiment a system and method is arranged for bridging the dead-band when asynchronous signals are compared against each other. There is developed a pair of phase related signals from one of the signals, each phase related signal phase shifted from each other, but having the same frequency as the signal from which it was derived. The other frequency signal is compared against each of the phase-related developed signals to generate an error signal which quadrature rotates when the first and second signals are out of frequency with each other. A control signal is generated when the quadrature rotation is outside a certain limit. The error signal is controllably buffered to insure that the error signal only occurs when the frequencies are offset for a selected period of time.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

DETAILED DESCRIPTION

Figure 2A:
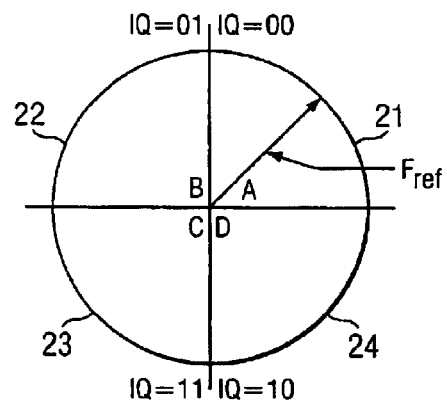
FIG. 2A shows a quadrant view of the rotational vector.

A digital implementation of rotational frequency detector 10 works by sampling two versions of an input clock, which are 90° out of phase (Fi and Fq), with a reference clock $F_{ref}$. These signals can be thought of forming four quadrants labeled A, B, C, and D as shown in FIG. 2A. When the input frequency $F_{vco}$ is identical to the reference frequency $F_{ref}$, the phase of the reference clock is static with respect to the input frequency. The reference vector is also static and does not change quadrants. When the frequencies are different, the phase of the reference clock changes with respect to the input frequency and the reference vector can be thought of as rotating with respect to the input. The sign of the frequency difference can be found by the direction of rotation: either A,B,C,D, . . . or D,C,B,A, . . . . The magnitude of the frequency difference also has to be found and compared to the dead-band frequency.

Figure 1:
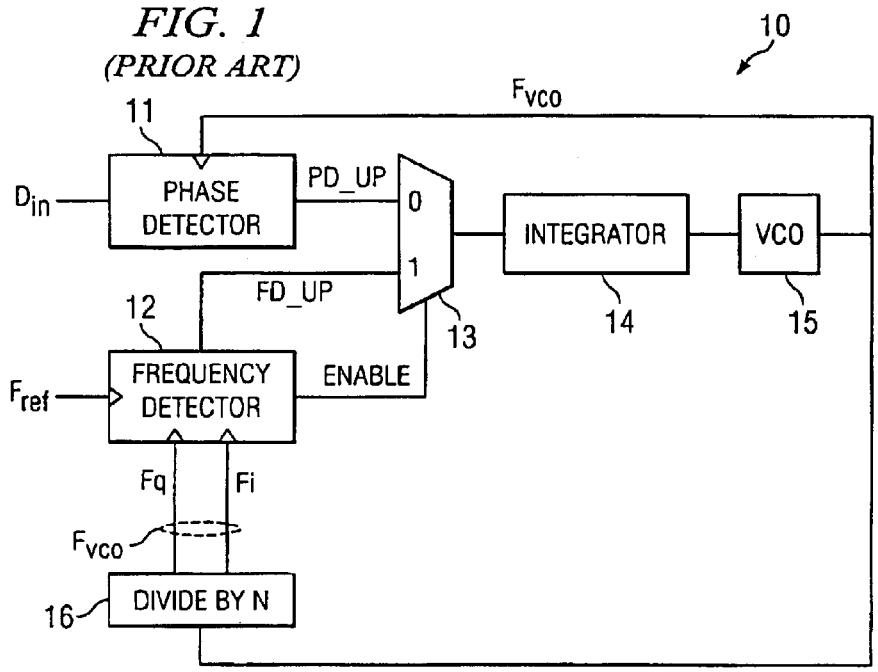
FIG. 1 is an example of a prior art data recovery circuit.

As discussed above, circuit 10 is either under control of phase detector 11 or frequency detector 12. This control is dependant upon a dead-band detector (not shown in FIG. 1) which uses the ENABLE lead to control multiplexer 13. The signal passing through multiplexer 13 is shaped by integrator 14 and is used to control voltage controlled oscillator VCO 15. The output of VCO 15 is fed back to phase detector 11.) It is also fed to divide by N circuit 16 which generates quadrature signals Fi and Fq which in turn are fed to frequency detector 12.

Figure 2B:
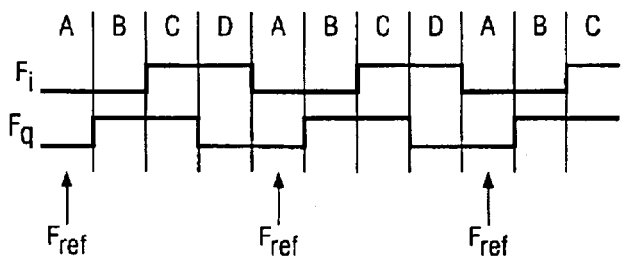
FIG. 2B shows graphically how the quadrature is determined.

FIG. 2A is a four-quadrant representation of the I and Q clocks. In quadrant 21(A), both I and Q are zero (0). In quadrant 22(B), I is 0 and Q is 1. Quadrant 23(C) shows both Q and I as 1 and quadrant 24(D) I is 1 while Q is 0. These values are determined as shown in FIG. 2B where Fi and Fq are compared against reference signal $F_{ref}$. As shown, in quadrant A both Fi and Fq are low (0). In quadrant B, Fi would be low (0) and Fq would be high (1) and likewise for all the quadrants.

Figure 3A:
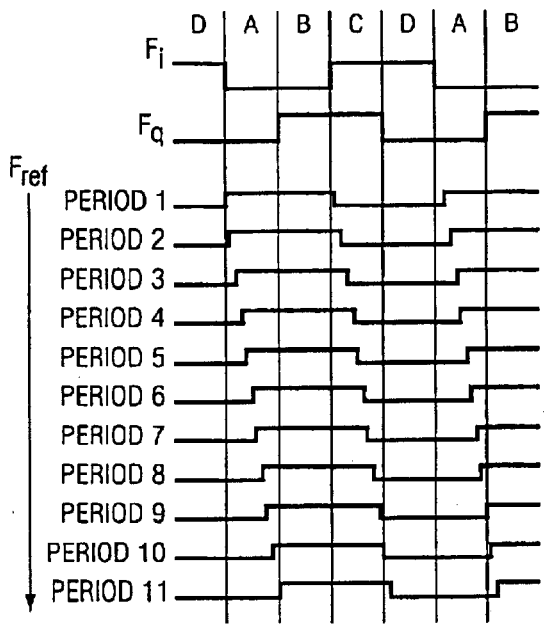
FIGS. 3A and 3B show how the vector rotates when out of sync.
Figure 3B:
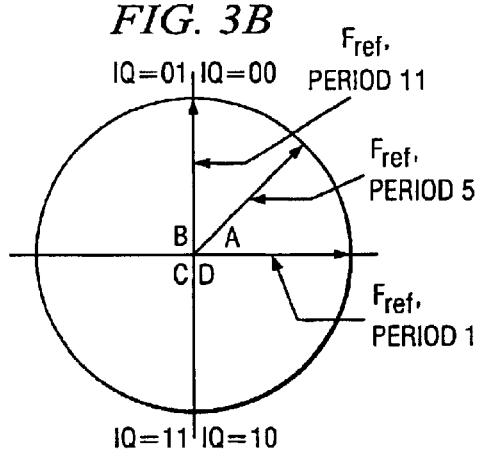

FIGS. 3A and 3B show how the vector of the reference frequency ($F_{ref}$) rotates counter clockwise when the period of $F_{ref}$ is longer than the period of the input frequency (from which Fi and Fq are derived). In this case, the period of $F_{ref}$ is 11/10 times the period of Fi (or Fq). The rising edge of $F_{ref}$, corresponding to the $F_{ref}$ vector, makes its first sample on the D/A border. It then takes 10 more samples for it to rotate to the A/B border.

Figure 4:
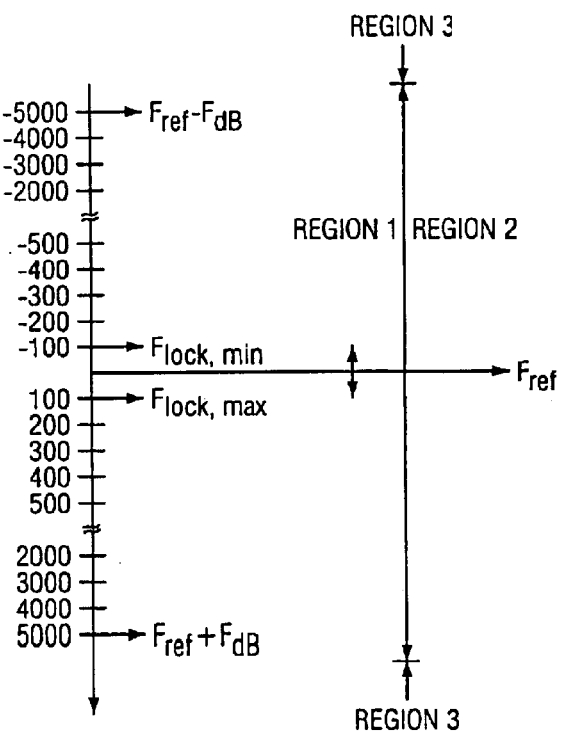
FIG. 4 shows different operating regions of the frequency detector and CDR circuits.

FIG. 4 shows different operating regions of the frequency detector and CDR circuits. Three different regions are described. For the example shown, the dead-band frequency is 5000 parts per million (ppm) different from the reference frequency. Phase lock is shown to occur when the input frequency is within 100 ppm of the reference frequency.

Region 1 is the region in which the CDR is in (or nearly in) phase lock. Here, the reference and input frequencies to the frequency detector are nearly identical. In some applications, the reference frequency can be different from the desired frequency (the frequency where phase lock occurs) by as much as 100 ppm. In other applications, the reference frequency is identical to the desired frequency, in which case there is no rotation of the $F_{ref}$ vector while in phase lock (so the beat frequency would be zero). In this region, the $F_{ref}$ vector is rotating very slowly (or not at all), with many periods of $F_{ref}$ per rotation. Since it is possible for the CDR to be phase locked within this region, any glitch from the dead-band indicator (asserting the ENABLE signal in FIG. 1) will cause the phase lock loop to be broken and phase lock to be lost. Glitches in this region cannot be tolerated.

The second region shown below is the dead-band region. In this region, the frequency detector ENABLE signal should be low. Since, by definition, phase lock is only possible while in region 1, glitches in region 2 that occur outside of region 1 are undesirable but not catastrophic. Region 3 is the region where the difference or beat frequency is larger than the dead-band frequency. The frequency detector ENABLE signal should be high when the circuit is operating in this region. Glitches in this region are also undesirable but not catastrophic.

Figure 5:
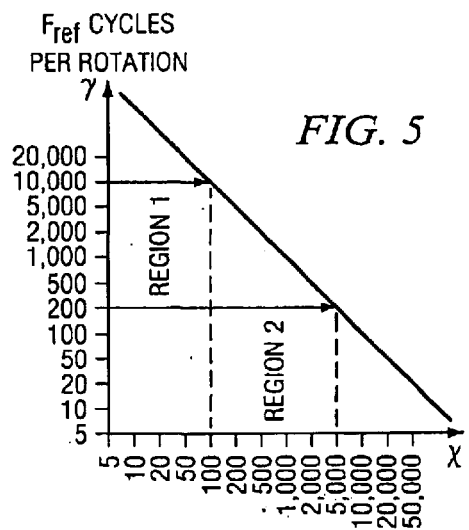
FIG. 5 shows the number of cycles of $F_{ref}$ vector.

FIG. 5 shows the number of cycles of $F_{ref}$ per single rotation of the $F_{ref}$ vector. The x-axis is the difference frequency between the reference frequency ($F_{ref}$) and the input frequency (in parts per million). The y axis is simply calculated by y=(1 million)/x. This simple plot illustrates how the number of samples of Fi and Fq per rotation of the $F_{ref}$ vector (from FIG. 3) increases when the circuit gets closer and closer to phase lock. A typical lock region of 100 ppm is shown on the graph. It can be seen that in this region there are at least 10,000 samples of Fi and Fq (which produce the signals I and Q) per rotation of the $F_{ref}$ vector. Stated another way, there are 10,000 cycles of $F_{ref}$ for each time the $F_{ref}$ vector makes one rotation. So, there will be at least 2,500 cycles of $F_{ref}$ per quadrant. A typical dead-band frequency is also shown at 5,000 ppm. At this difference in frequency, there are at least 200 samples per rotation.

Figure 6A:
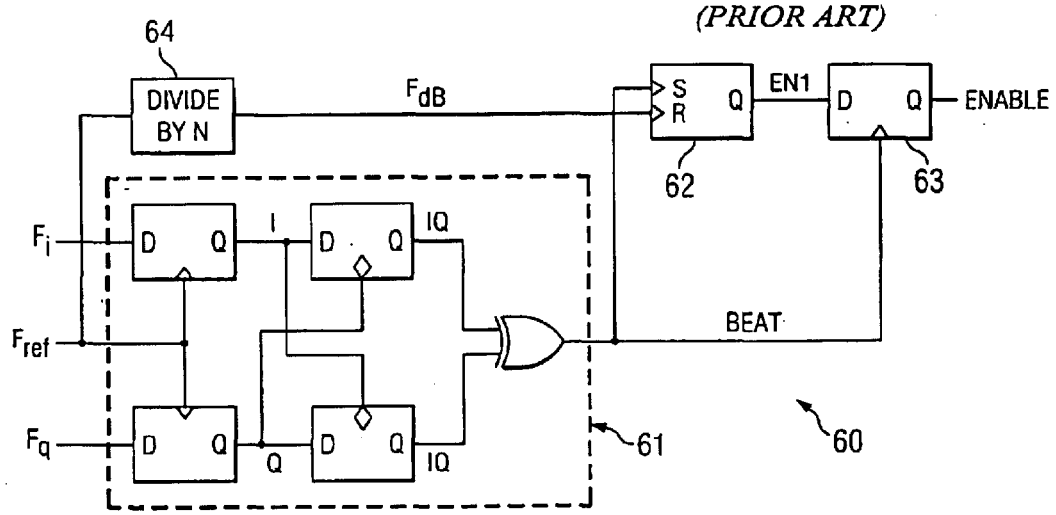
FIG. 6A illustrates one prior art dead-band detector.

FIG. 6A shows one prior solution 60, as described in the above mentioned Wu patent, which compares the frequency difference to the dead-band frequency. Fi and Fq are sampled by the reference frequency to give signals I and Q. I and Q next go to a debouncing circuit that produces an output beat signal BEAT. In this circuit, the beat signal is equal to twice the difference in frequency between the input and reference frequencies. This is also equivalent to twice the rotational frequency of the phase of $F_{ref}$ in the 4-quadrant representation in FIGS. 2 and 3. Debouncing circuit 61 requires both I and Q to change in order to produce a change of the BEAT signal. It consists of two double edge triggered flip-flops and an XOR gate. This is needed to prevent the BEAT signal from toggling if the $F_{ref}$ vector is jittering around either the I or Q transition. So, the phase of $F_{ref}$ must change by at least 90° in order to change the BEAT signal.

Output SR flip-flop 62 and D flip-flop 63 compare the BEAT signal to the dead-band frequency $F_{db}$. The dead-band frequency is determined by divide by N circuit 64. In order for output ENABLE to go high (signaling that the frequency difference is greater than $F_{db}$), BEAT must produce two rising edges (one to set SR flip-flop 62, the next to sample the set output) before the SR flip-flop receives one rising edge from $F_{db}$ (which resets SR flip-flop 62).

Figure 6B:
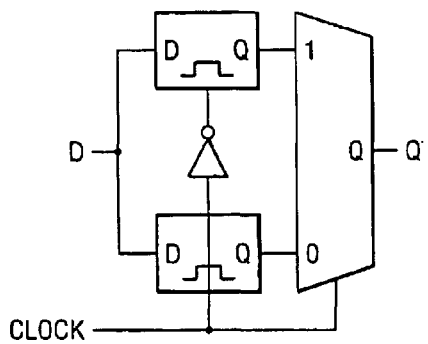
FIG. 6B shows an example of a double edge triggered flip-flop.
Figure 6C:
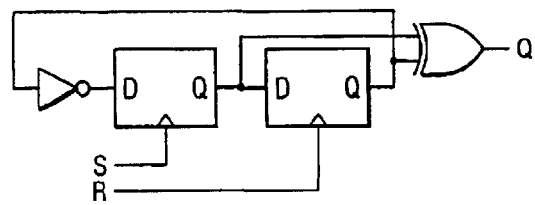
FIG. 6C shows an example of an SR flip-flop.

FIG. 6B shows one example of a double edge triggered flip-flop, and FIG. 6C shows one example of an SR flip-flop.

The problem with the circuit of FIG. 6A is that a metastability on either I or Q can cause a glitch at the output. Since Fi and Fq are asynchronous with $F_{ref}$, they can each be metastable (but not at the same time, since they are 90° out of phase). When the circuit is operating close to or in phase lock, the phase of the $F_{ref}$ vector is rotating slowly through the quadrants (if at all). So, there are many samples of Fi and Fq per quadrant.

Figure 7:
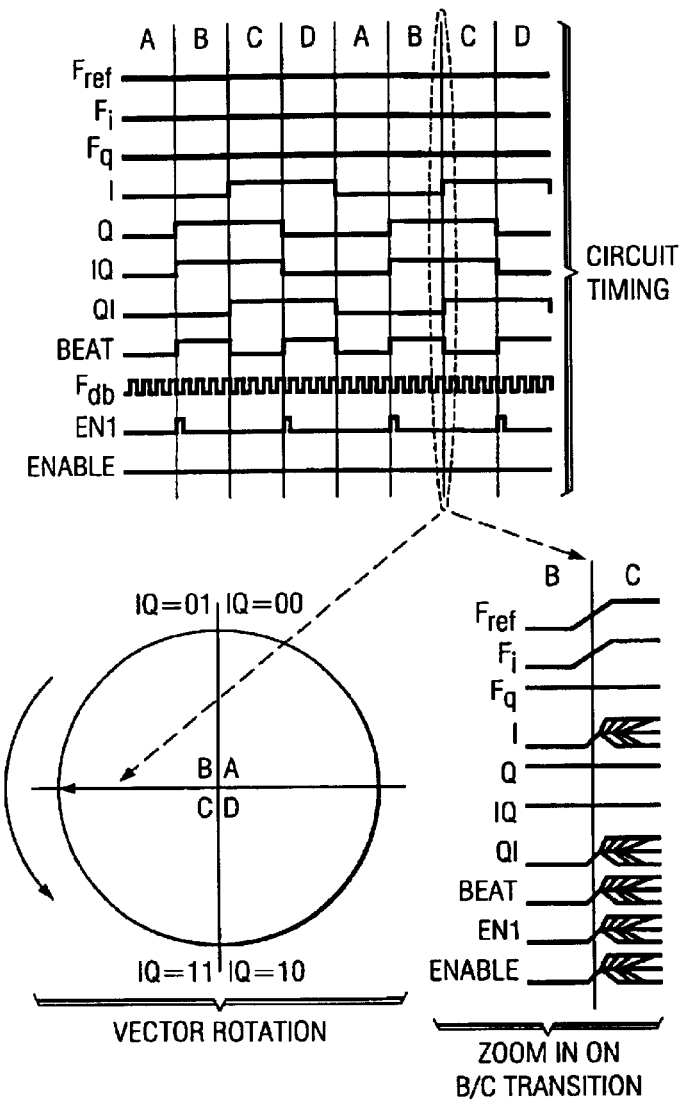
FIG. 7 illustrates the prior art metastability problem.

In the example shown in FIG. 7, the frequency of $F_{ref}$ is slightly less than the input frequency. The phase of $F_{ref}$ is rotating slowly through the quadrants as A,B,C,D with many samples per quadrant. This produces the waveforms shown. When the vector $F_{ref}$ gets to the BC border, there is a chance it will land exactly on the border, causing I to be metastable. The timing diagram shows different possibilities for the signal I. It will start out with a voltage very close to the metastable voltage of the latch. The output will then regenerate away from this voltage, either positively or negatively. The closer the starting voltage is to the exact metastable voltage, the longer it will take to regenerate. I is the clock input to the double edge triggered flip-flop which produces QI. Since the input Q and the output QI are different in normal operation when the vector $F_{ref}$ crosses the BC border, a metastability on I (which is the clock input) could produce a metastability at the output. Hence, QI will not be determined until I is determined. So, the metastability on I will cause a metastability on QI. This causes the BEAT signal to become metastable, since the XOR gate cannot resolve a metastability. This metastability on BEAT could then cause a glitch at the output. This glitch occurs because the BEAT signal, if metastable, could be interpreted as a rising edge by the SR flip-flop before the output of the SR flip-flop (ENI) is sampled. In this case, only one edge of BEAT causes the output to be high. Even though such an event is rare it cannot be tolerated. As mentioned earlier, a glitch on the ENABLE output of the frequency detector breaks the phase tracking loop of the CDR, causing it to drift out of phase lock.

Another problem with the circuit is that a collision between $F_{db}$ and BEAT causes the output of the SR flip-flop to be metastable. This metastability cannot be resolved until the circuit regenerates. Therefore, it cannot be reset until the regeneration occurs. A collision between $F_{db}$ and BEAT could occur if the timing of the divide by N circuit has an uncontrolled delay with respect to $F_{ref}$. This is often the case since the divide by N circuit is often done with a ripple counter. In this case, $F_{db}$ and BEAT could end up colliding. The amount of time that the circuit has to regenerate from a metastability caused by this collision is inversely proportional to the difference in frequency between the input and reference frequency. So the closer the frequencies are, the longer this problem has to resolve.

In order for the circuit above to operate with an acceptable error probability (sufficiently close to zero) due to metastability on I and Q, care must be taken to insure that either enough delay (by pipelining flip-flops) is allowed or the regenerative time constant of the flip-flops is sufficiently small. Both solutions take increased area, power, or both.

Figure 8:
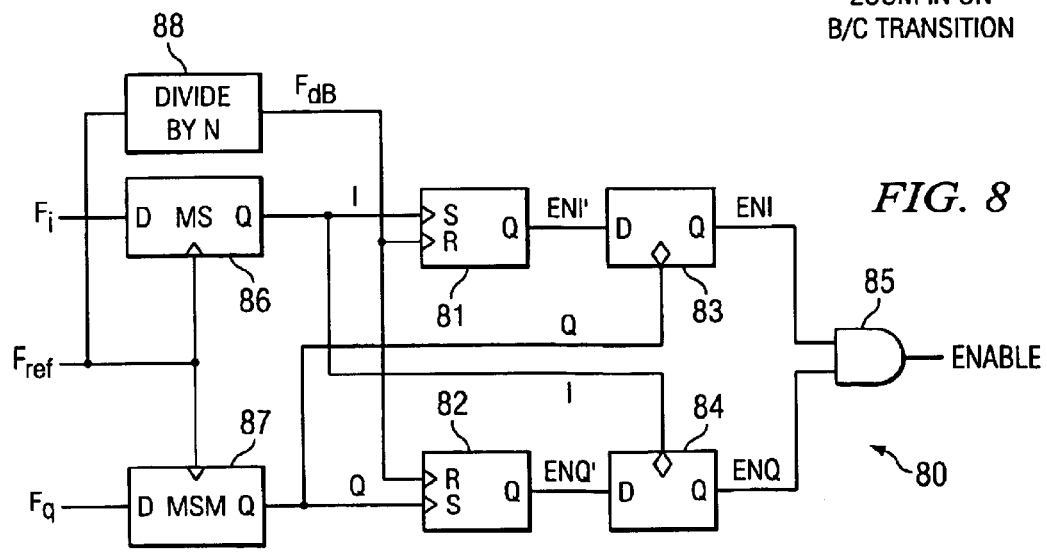
FIG. 8 illustrates one embodiment of a circuit where metastability does not effect the output.

FIG. 8 illustrates one embodiment 80 of a circuit that does not have the metastability problems of previous circuits. While metastability still occurs within the circuit (since it is an asynchronous circuit) advantage is taken of the 90° phase shift between Fi and Fq to prevent the internal metastability from effecting the output. Since, only one of the sampled versions of the input clock, I or Q, can be metastable at one time, there is always at least one known good sampled version of the input clock.

When the circuit is in, or near, the dead-band, the vector $F_{ref}$ is rotating slowly, with many samples per quadrant. I and Q, which are the sampled versions of Fi and Fq, transition at the beat, or difference, frequency. I and Q can be thought of as beat frequencies by themselves, although not debounced beat frequencies. The vector $F_{ref}$ can be sampling either an Fi transition or an Fq transition, but not both at the same time, since Fi and Fq are 90° out of phase. In order to be a robust dead-band detector, the circuit should also require at least a 90° rotation of the vector $F_{ref}$ before ENABLE is asserted.

The circuit has two paths that determine if the input clock (from which Fi and Fq are derived) is beating against the reference clock ($F_{ref}$) with a frequency greater that that of $F_{db}$. This is done with two SR flip-flops 81 and 82 connected to I and Q derived via flip-flops 86 and 87, respectively, whose outputs are sampled by transitions of the opposite signal by D flip-flops 83 and 84. Each SR flip-flop takes a rising edge of I or Q to set ENI' or ENQ' to a 1. If no rising edge of $F_{db}$ comes before vector $F_{ref}$ rotates 90° (so that I can sample ENQ' or Q can sample ENI') then ENI or ENQ becomes a 1. This 90° requirement for sampling of ENI' or ENQ' provides the debouncing required to protect against multiple transitions of either I or Q causing a false enable output. If both ENI and ENQ are 1 at the same time, this indicates that the beat frequency is greater than the deadband frequency and ENABLE is high, under control of AND gate 85.

This circuit handles metastabilities on I and Q because it gates the ENABLE signal generated by either the I or Q signal with the opposite signal (I for ENQ and Q for ENI). The previous circuit (FIG. 6A) gated I and Q with the opposite signal (Q with I and I with Q). When inside the dead-band, metastabilities can only occur on either I or Q, but not on both at the same time. Divide by N circuit 88 determines the width of the dead-band by determining $F_{db}$.

Figure 9:
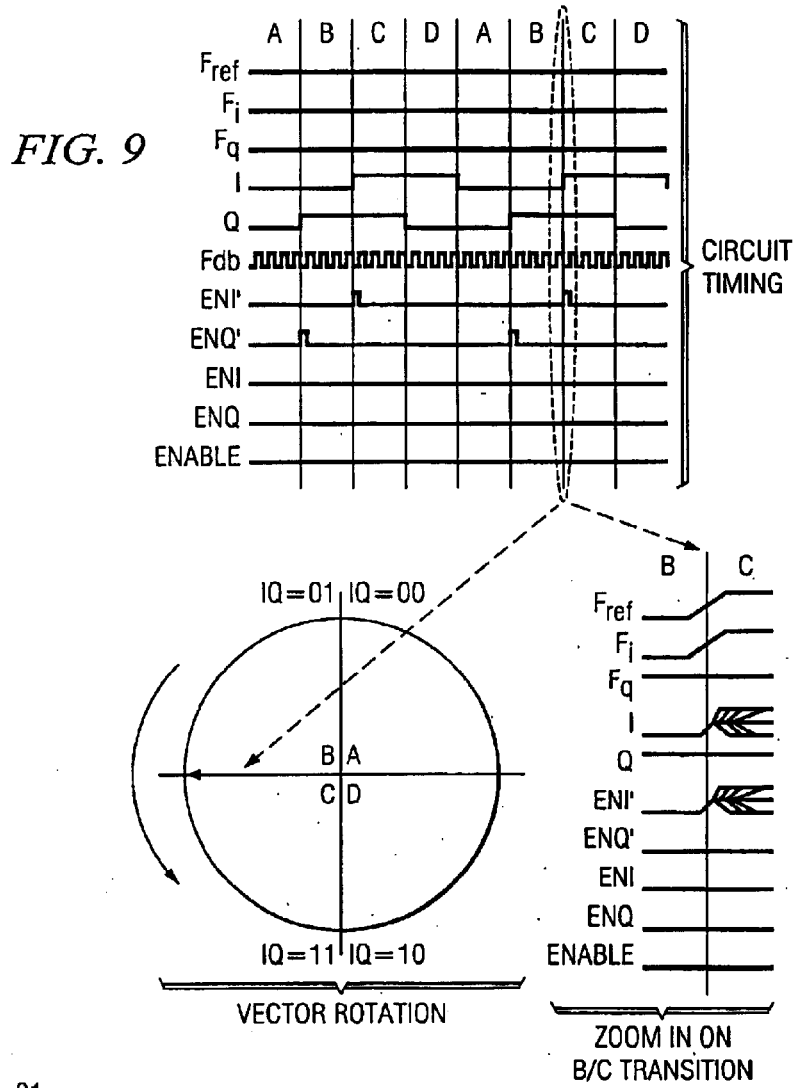
FIG. 9 shows the dead-band operation of the circuit of FIG. 8.

FIG. 9 shows the dead-band operation of circuit 80. It can be seen that ENI and ENQ should remain low at all times when the circuit is within the dead-band region. ENI' and ENQ' go high between the rising edges of I or Q and the next rising edge of $F_{db}$, ENI' and ENQ' are clocked by Q and I respectively. So, the vector $F_{ref}$ must rotate 90° before ENI' and ENQ' once set are sampled.

The timing diagram at the right of FIG. 9 shows the circuit behavior for the example of a metastability on I. The same diagram applies for a metastability on Q, only at the AB border, not the BC border. In this example, like in the example for the circuit of FIG. 6A, the rising edge of $F_{ref}$ occurs at exactly the same time as the rising edge of Fi. When this happens, the internal circuit becomes metastable. This metastability can cause the output of the SR flip-flop, ENI', to become metastable. The SR flip-flop could remain in an metastable state until I becomes resolved and the SR flip-flop regenerates. Only then can it be reset by $F_{db}$. It will regenerate with a time equal to $$t = \tau \ln\left(\frac{V_{FS} - V_{MS}}{v(0) - V_{MS}}\right).$$

However, if $F_{ref}$ is rotating, it should only make one sample of Fi that is exactly on the metastable point of the transition. In this case, I will be resolved at the next clock cycle of $F_{ref}$ (because $F_{ref}$ will sample a voltage away from $V_{MS}$). But, the SR flip-flop cannot be reset by $F_{db}$ until it resolves. The time it takes for the SR flip-flop to resolve helps determine the mean time to failure. The faster the SR flip-flop resolves, the longer the expected time to failure would be.

Figure 10:
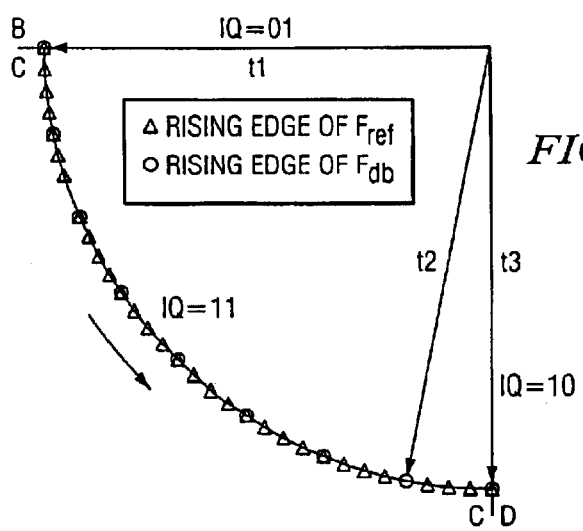
FIG. 10 is a quadrant timing example.

FIG. 10 shows the time allowed for ENI' to regenerate before it is sampled by Q. Rising edges of $F_{ref}$ and $F_{db}$ are shown with symbols along the path traced by the $F_{ref}$ vector. In this example, a rising edge of $F_{db}$ occurs once for every four rising edges of $F_{ref}$. In typical applications, there are usually hundreds or thousands of cycles of $F_{ref}$ for every edge of $F_{db}$. The direction of rotation is indicated as B,C, D,A. The time that $F_{ref}$ first reaches the BC border is shown as t1. The last rising edge of $F_{db}$ in quadrant C occurs at time t2. $F_{ref}$ reaches the CD border, where Q goes high at t3.

In this example, assume ENI' can become metastable as a result of I becoming metastable at the BC border shown at time t1. In order for the metastability to be clocked by Q, it must persist until the CD border when Q changes. This is shown as t3. However, in order for the circuit to avoid having a glitch on ENI, ENI' must be resolved by t2, so that the SR flip-flop can be reset by a rising edge of $F_{db}$ before the CD border is reached. In this example, the metastability must persist for many cycles of $F_{ref}$. It must persist for most of a 90° rotation. Even if the metastability does persist and is not reset, the ENABLE signal would still remain low because it is ANDed with ENQ, which should be low.

Continuing with this example, a metastability on I will not affect the ENQ branch. If the circuit is operating in the dead-band region, ENQ' and ENQ will always be zero by the time the $F_{ref}$ vector rotates to a transition of I (which occurs at the BC border in this example). Since ENQ' and ENQ would both be zero, a metastability on I would not affect ENQ.

For a metastability on ENI' to reach ENI in the example discussed, the metastability would have to persist for the time it takes $F_{ref}$ to rotate close to 90°. This time is approximately equal to one quarter of the period of the beat frequency. The actual time is derived below. If the circuit is phase locked, the maximum difference of frequency in a typical system is 100 ppm. So, the period of the beat frequency would be 10,000 times the period of $F_{ref}$. There would be a minimum of 2,500 periods (one quarter of the number of periods in one full rotation) of $F_{ref}$ for the SR flip-flop to resolve before the metastability on ENI' could be sampled by the next edge of Q to ENI. For a glitch to occur at the ENABLE output, this unlikely event would have to occur to the I branch (like in the preceding analysis) and then be duplicated in the Q branch in succession. This causes the small probability of a glitch due to metastability to be squared, making it even smaller.

A similar problem to the case of a metastability on either I or Q is a metastability caused by I or Q colliding with $F_{db}$. This would cause a metastability on either ENI' (if $F_{db}$ collides with I) or ENQ' (if $F_{db}$ collides with Q). If the divider which generates $F_{db}$ is designed as a ripple counter (which is the lowest gate count implementation of a binary divider), its output timing cannot easily be controlled with respect to $F_{ref}$. A case can be imagined where rising edges of $F_{db}$ line up with one edge of $F_{ref}$. Since I and Q transition on edges of $F_{ref}$, it is possible that I or Q could routinely collide with $F_{db}$. To protect against the possibility that I and Q both collide with $F_{db}$, I is latched using a master-slave flip-flop and Q is latched using a master-slave-master flip-flop (shown in FIG. 8) causing the transitions of Q occur half of an $F_{ref}$ cycle after transitions of I. Since I and Q are offset by one half of an $F_{ref}$ period, the rising edge of $F_{db}$ could only have the possibility of colliding with either I or Q, but not both. A metastability on ENI' or ENQ' is resolved in the same way whether it was caused by a metastability on I or Q or a collision with I or Q.

For a metastability to affect the output of either branch (ENI or ENQ), the metastability would have to persist on ENI' or ENQ' for almost one quarter of a rotation. The number of $F_{ref}$ periods this corresponds to depends on the difference between the reference frequency and the input frequency. The closer the two frequencies are, the more periods of $F_{ref}$ there are per rotation of the $F_{ref}$ vector. When the two frequencies are identical, there is no rotation and the number of cycles of $F_{ref}$ per rotation is infinite.

As shown in FIG. 10, the metastability must be resolved before the last rising edge of $F_{db}$ before the $F_{ref}$ vector has rotated 90°. Some important relationships are given below:

Beat frequency=$(F_{ref}-F_{in})=F_{beat}$

Number of periods of $F_{ref}$ per period of $F_{db}=F_{ref}/F_{db}$

Number of periods of $F_{ref}$ per rotation=$F_{ref}/(F_{ref}-F_{in})=F_{ref}/F_{beat}$ Number of periods of $F_{ref}$ per quadrant=$(\frac{1}{4})*F_{ref}/(F_{ref}-F_{in})=F_{ref}/F_{beat}$ Number of periods of $F_{db}$ per rotation=$F_{db}/F_{beat}$ Number of periods of $F_{db}$ per quadrant=$(\frac{1}{4})*F_{db}/F_{beat}$ The number of $F_{ref}$ cycles allowed for a metastability to resolve before affecting ENI or ENQ is $(F_{ref}/F_{db})*[((\frac{1}{4})*F_{db}/F_{beat})-1]$. This corresponds to a time of $t_{resolve}=(1/F_{db})*[((\frac{1}{4})*F_{db}/F_{beat})-1]$. Several observations can be made about this result. First, the closer the two frequencies are, the longer there is to resolve metastability. This is because as $F_{beat}$ approaches zero, $t_{resolve}$ goes to infinity. Second, the actual time is determined by the period of $F_{beat}$, which is the difference of the $F_{ref}$ and $F_{in}$. If $F_{ref}$ and $F_{in}$ were both divided by N before comparison, then the beat frequency would also go down by a factor of N, allowing N times longer to resolve. However, this can have negative effects on the entire CDR circuit. Next, the larger $F_{db}$ is, the longer there is to resolve. This is because the larger the dead-band frequency, the more rising edges (which reset the SR flip-flop) there are per rotation and therefore per quadrant. The fraction of the quadrant that can be used for regeneration is (Number of periods of $F_{db}$ per quadrant−1)/(Number of periods of $F_{db}$ per quadrant). As $F_{db}$ becomes large (or $F_{beat}$ becomes small), almost all of the quadrant can be used for regeneration and $t_{resolve} \sim = 1/(4*F_{beat})$. When the number of periods of $F_{db}$ per quadrant drops below one, then the circuit is by definition out of the dead-band region. In this case, glitches will not affect catastrophically the CDR circuit because it cannot possibly be in phase lock.

In typical applications, the difference frequency between the input and the reference frequency is 100 ppm. There would be 10,000 cycles of $F_{ref}$ per rotation or 2,500 cycles of $F_{ref}$ per quadrant. If the dead-band frequency is set at 5000 ppm, there would be 50 cycles of $F_{db}$ per rotation or 12.5 per quadrant. Since a metastability must resolve before the quadrant boundary, only 11.5 of the 12.5 cycles can be used. This gives 2,300 cycles of $F_{ref}$ to resolve. The previous circuit could fail within one $F_{ref}$ cycle because a metastability on I or Q could cause a glitch on the output while I or Q was resolving. In order to achieve similar performance using the previous circuit, thousands of gates would have to be added to make sure I and Q were regenerated before they are used. This would cause the power and area quite large.

Although the present invention and its advantages have been described in detail, it should be understood that various changes, substitutions and alterations can be made herein without departing from the invention as defined by the appended claims. Moreover, the present application is not intended to be limited to the particular embodiments of the process, machine, manufacture, composition of matter, means, methods and steps described in the specification. As one will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for bridging dead-band when a signal having a first frequency is compared against a signal having a second frequency, said method comprising:
   developing from said second frequency signal a pair of phase related signals each of said phase related signals having the same frequency but phase shifted from each other, said same frequency being controlled by said second frequency signal;
   comparing said first signal against each of said phase related signals to generate a quadrature vector that rotates when said first and second frequency signals differ in frequency from each other; and
   resolving a metastability by allowing a portion of a rotation of the quadrature vector before asserting an output signal.

2. The method of claim 1 wherein said method further comprises:
   generating a control signal when said quadrature rotation is outside a certain limit.

3. The method of claim 2 wherein said certain limit is controllable.

4. The method of claim 2 wherein said certain limit is different for different quadrature rotation directions.

5. The method of claim 2 wherein said comparing comprises:
   generating the output signal based on a mismatch between said first frequency signal and each of said generated phase-shifted signals;
   deriving a frequency divided signal from said first frequency signal; and
   clocking said output signal against said frequency divided signal.

6. The method of claim 5 further comprising:
   adjusting said frequency divided signal to control said certain limit.

7. A system for bridging dead-band when a first signal having a first frequency is compared against a second signal having a second frequency, said system comprising:
   circuitry for developing from one of said signals a pair of phase related signals each said phase related signal having the same frequency as said signal from which said phase related signals developed;
   comparing circuitry for comparing the other of said signals against each of said phase related signals to generate a quadrature vector that rotates when said first and second signals differ in frequency from each other; and
   circuitry for allowing a portion of a rotation of the quadrature vector before asserting an output signal to resolve a metastability.

8. The system of claim 7 further comprising:
   generating circuitry for generating a control signal when said quadrature rotation is outside a certain limit.

9. The system of claim 8 wherein said certain limit is controllable.

10. The system of claim 8 wherein said certain limit is different for different quadrature rotation directions.

11. The system of claim 8 wherein said comparing circuitry comprises:
    circuitry for generating the output signal based on a mismatch between said other of said signals and each of said generated phase-shifted signals;
    circuitry for deriving a frequency divided signal from said other of said signals; and
    circuitry for clocking said output signal against said frequency divided signal.

12. The system of claim 11 further comprising:
    circuitry for adjusting said frequency divided signal to control said certain limit.

13. A circuit for comparing two asynchronous signals, said circuit comprising:
    a phase detector;
    a frequency detector for detecting both the magnitude and polarity of any frequency difference between said signals, said frequency detector yielding control of said circuit to said phase detector when the frequency difference is within a dead-band region; and
    circuitry for delaying a glitch within said dead-band region for a period of time to allow the glitch to resolve.

14. The circuit of claim 13 further comprising:
    circuitry for developing from a first one of said signals a pair of phase related signals each said phase related signal having the same frequency as first one of said signals but phase shifted 90 degrees therefrom; and
    circuitry for comparing a second one of said signals against each of said phase-related signals to generate a quadrature rotating error signal when said compared signals differ in frequency from each other.

15. The circuit of claim 14 wherein said comparing circuitry comprises:
    circuitry for generating output signals based on mismatches between the second one of said signals and each of said generated phase-shifted signals;

circuitry for deriving a frequency divided signal from said first one of said signals; and circuitry for clocking said output signals against said frequency divided signal.

16. The circuit of claim 15 further comprising:

circuitry for adjusting a frequency divided signal to control a certain limit.

17. A method for comparing two asynchronous signals, said method comprising the steps of:

comparing the phase of said signals;

comparing both the magnitude and polarity of any frequency difference between said signals to yield control to said phase comparison when the frequency difference is within a dead-band region;

generating quadrature signals from one of said compared signals;

comparing the other of said signals against said quadrature signals to yield a signal which has a speed of rotation having a relationship to any mismatch between said signals, and delaying a glitch within said dead-band region for a period of time to allow the glitch to resolve said delaying a function of said speed of said phase rotation.

18. A VCO circuit having a VCO output voltage and a reference voltage, said circuit comprising:

a phase detector;

a frequency detector for detecting both the magnitude and polarity of any frequency difference between said reference signal and said VCO output voltage, said frequency detector yielding control of said circuit to said phase detector when the frequency difference is within a dead-band region; and circuitry for delaying a glitch within said dead-band region for a period of time to allow the glitch to resolve.

19. The VCO circuit of claim 18 further comprising:

circuitry for developing from said VCO output voltage a pair of phase related signals each said phase related signal having the same frequency as said VCO output voltage but phase shifted 90 degrees therefrom; and circuitry for comparing said reference signal against each of said developed signals to generate a quadrature rotating an error signal when said reference signal and said VCO output voltage are out of frequency with each other.

\* \* \* \* \*